United States Patent
Lee et al.

(10) Patent No.: US 7,800,162 B2
(45) Date of Patent: Sep. 21, 2010

(54) NONVOLATILE MEMORY DEVICE AND METHOD OF FABRICATING THE SAME

(75) Inventors: Sung-hae Lee, Yongin-si (KR); Ki-yeon Park, Seoul (KR); Min-Kyung Ryu, Seoul (KR); Myoung-bum Lee, Seoul (KR); Jun-noh Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 72 days.

(21) Appl. No.: 12/235,689

(22) Filed: Sep. 23, 2008

(65) Prior Publication Data

US 2009/0159955 A1 Jun. 25, 2009

(30) Foreign Application Priority Data

Dec. 20, 2007 (KR) .................. 10-2007-0134450

(51) Int. Cl.
 *H01L 29/94* (2006.01)
(52) U.S. Cl. .................... 257/321; 257/314
(58) Field of Classification Search ............ 257/321, 257/314
See application file for complete search history.

(56) References Cited

U.S. PATENT DOCUMENTS

| 7,122,415 B2 | 10/2006 | Jang et al. |
| 7,498,222 B1 * | 3/2009 | Foster et al. ............... 438/261 |
| 2007/0228447 A1 * | 10/2007 | Ozawa ....................... 257/314 |

FOREIGN PATENT DOCUMENTS

| JP | 2005-197363 | 7/2005 |
| JP | 2006-310662 | 9/2006 |

\* cited by examiner

*Primary Examiner*—Douglas M Menz
(74) *Attorney, Agent, or Firm*—Volentine & Whitt, P.L.L.C.

(57) ABSTRACT

A nonvolatile memory device includes a semiconductor substrate, a tunneling insulation layer on the semiconductor substrate, a charge storage layer on the tunneling insulation layer, an inter-electrode insulation layer on the charge storage layer, and a control gate electrode on the inter-electrode insulation layer. The inter-electrode insulation layer includes a high-k dielectric layer having a dielectric constant greater than that of a silicon nitride, and an interfacial layer between the charge storage layer and the high-k dielectric layer. The interfacial layer includes a silicon oxynitride layer.

18 Claims, 5 Drawing Sheets

NONVOLATILE MEMORY DEVICE AND METHOD OF FABRICATING THE SAME

CROSS-REFERENCE TO RELATED PATENT APPLICATION

A claim of priority is made to Korean Patent Application No. 10-2007-0134450, filed on Dec. 20, 2007, the subject matter of which is hereby incorporated by reference.

BACKGROUND OF THE INVENTION

1. Field of the Invention

The present invention relates to a semiconductor device, and more particularly, to a nonvolatile memory device capable of retaining data when electric power is cut off.

2. Description of the Related Art

Highly integrated, high-capacity nonvolatile memory devices have been rapidly developed to meet the increasing demand for portable storage devices. Examples of nonvolatile memory devices include programmable read only memories (PROMs), erasable and programmable read only memories (EPROMs), and electrically erasable and programmable read only memories (EEPROMs). Flash memories, a kind of EEPROM, are widely used.

A typical flash memory has a stacked structure including a tunneling insulation layer, a floating gate electrode, an inter-electrode insulation layer, and a control gate electrode that are formed on a semiconductor substrate. Cell characteristics of the flash memory vary depending on the thickness of the tunneling insulation layer, the contact area between the floating gate electrode and the semiconductor substrate, the contact area between the floating gate electrode and the control gate electrode, and/or the thickness of the inter-electrode insulation layer. Important characteristics of flash memory cells include programming speed, erasing speed, distribution of programming cells, and distribution of erasing cells. Characteristics of the flash memory cell, such as programming/erasing endurance and data retention characteristics, are related to the reliability of the flash memory.

In general, programming speed and erasing speed depend on the coupling ratio ($\gamma$) expressed by Equation 1 below. The coupling ratio ($\gamma$) is a ratio of a voltage induced at a floating gate electrode to a voltage applied to a control gate electrode. The coupling ratio ($\gamma$) depends on the capacitance $C_{tunnel}$ of a tunneling insulation layer and the capacitance $C_{block}$ of an inter-electrode insulation layer.

$$\gamma = \frac{C_{block}}{C_{tunnel} + C_{block}} \quad \text{[Equation 1]}$$

When the coupling ratio ($\gamma$) is high, high programming speed and erasing speed can be attained at a given operating voltage. Therefore, it is generally desirable to decrease the capacitance $C_{tunnel}$ and/or to increase the capacitance $C_{block}$.

Recent, highly integrated flash memories suffer from undesired coupling interference between neighboring floating gate electrodes due to the reduced design rule. The height of floating gate electrodes can be reduced to decrease mutually facing portions (overlapping portions) of neighboring floating gate electrodes, which reduces coupling interference between the neighboring floating gates. However, in this case, the capacitance $C_{block}$ of the inter-electrode insulation layer is reduced, thus reducing the coupling ratio ($\gamma$). This decreases the programming/erasing speed of a flash memory.

SUMMARY OF THE INVENTION

According to an aspect of the present invention, there is provided a nonvolatile memory device including a semiconductor substrate, a tunneling insulation layer on the semiconductor substrate, a charge storage layer on the tunneling insulation layer, an inter-electrode insulation layer on the charge storage layer, and a control gate electrode on the inter-electrode insulation layer. The inter-electrode insulation layer includes a high-k dielectric layer having a dielectric constant greater than that of a silicon nitride, and an interfacial layer between the charge storage layer and the high-k dielectric layer. The interfacial layer includes a silicon oxynitride layer.

The inter-electrode insulation layer may further include a first subsidiary interfacial layer between the charge storage layer and the interfacial layer, and/or a second subsidiary interfacial layer between the interfacial layer and the high-k dielectric layer.

The control gate electrode may include a metal layer having a work function of 4.0 eV or higher. Also, the charge storage layer may include a floating type polysilicon layer or an insulation layer containing nanoparticles. For example, the charge storage layer may include nanocrystals or quantum dots.

The silicon oxynitride layer may include about 5 to about 35 atomic percent of nitrogen.

According to another aspect of the present invention, there is provided a method of fabricating a nonvolatile memory device. In the method, a tunneling insulation layer is formed on a semiconductor substrate, and a charge storage layer is formed on the tunneling insulation layer. An inter-electrode insulation layer is formed on the charge storage layer. A control gate electrode is formed on the inter-electrode insulation layer. The forming of the inter-electrode insulation layer includes forming an interfacial layer on the charge storage layer and forming a high-k dielectric layer on the interfacial layer. The high-k dielectric layer has a dielectric constant greater than that of a silicon nitride layer. The interfacial layer includes a silicon oxynitride layer.

The interfacial layer may be formed by depositing a silicon oxynitride layer on the charge storage layer by chemical vapor deposition (CVD) or atomic layer deposition (ALD).

The forming of the interfacial layer may include forming a silicon oxide layer on the charge storage layer and nitriding the silicon oxide layer. Alternatively, the forming of the interfacial layer may include forming a silicon nitride layer on the charge storage layer and oxidizing the silicon nitride layer.

BRIEF DESCRIPTION OF THE DRAWINGS

Exemplary embodiments of the present invention will be described with reference to the attached drawings, in which.

DETAILED DESCRIPTION OF THE EMBODIMENTS

The present invention will now be described more fully with reference to the accompanying drawings, in which exemplary embodiments of the invention are shown. The invention may, however, be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. In the drawings, the thicknesses of layers and regions are exaggerated for clarity. It will also be understood that when a layer is referred to as being "on" another layer or substrate, it can be directly on the other layer or substrate, or intervening layers may also be present. Throughout the drawings and written description, like reference numerals will be used to refer to like or similar elements.

Figure 1:
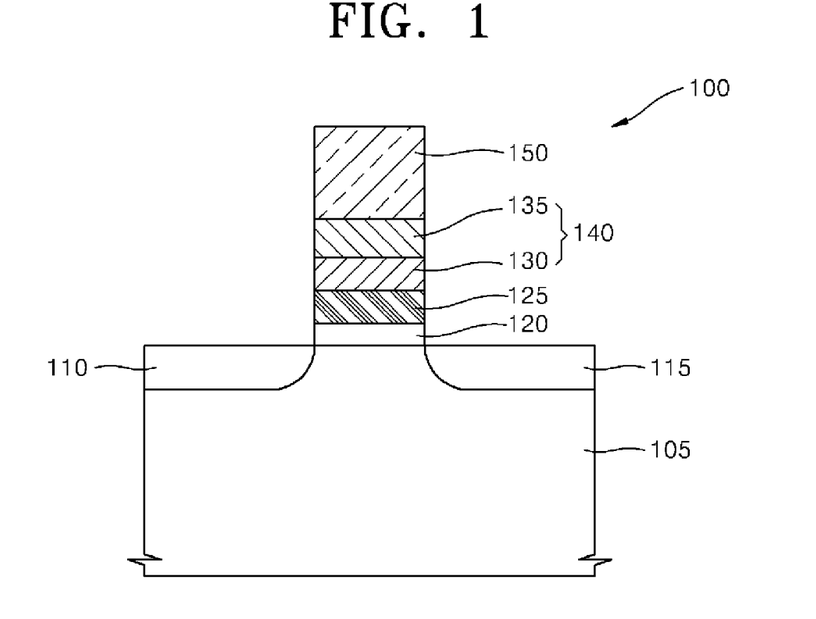
FIG. 1 is a cross-sectional view illustrating a nonvolatile memory device, according to an embodiment of the present invention.

FIG. 1 is a cross-sectional view illustrating a nonvolatile memory device 100, according to an illustrative embodiment of the present invention.

Referring to FIG. 1, a source region 110 and a drain region 115 are formed in a semiconductor substrate 105 at a predetermined distance away from each other. For example, the source region 110 and the drain region 115 can be formed by doping regions of the semiconductor substrate 105 at a high concentration using impurities different from those used for doping the semiconductor substrate 105. The source region 110 and the drain region 115 may be distinguishable based on their respective functions. In some embodiments, however, the source region 110 and the drain region 115 may be not distinguishable from each other, and thus each may be referred to as a source/drain region.

A tunneling insulation layer 120 is formed on the semiconductor substrate 105 between the source region 110 and the drain region 115. The tunneling insulation layer 120 may be formed by thermal oxidation or chemical vapor deposition (CVD), for example. The thermal oxidation method that can be used for forming the tunneling insulation layer 120 includes dry and wet oxidation methods. For example, the tunneling insulation layer 120 can be formed by wet oxidation at a temperature range of about 700° C. to about 800° C. Then, the tunneling insulation layer 120 can be treated by annealing at about 900° C. for about 20 minutes to 30 minutes in a nitrogen atmosphere, for example.

The thickness of the tunneling insulation layer 120 may be adjusted based on charge tunneling and retention characteristics. For example, the thickness of the tunneling insulation layer 120 may be about 50 Å to about 500 Å. The tunneling insulation layer 120 may have a single layer structure or a multi-layer structure, including layers having different energy band gaps. For example, the tunneling insulation layer 120 may be formed from one or a combination of $SiO_2$, $Si_3N_4$, $SiO_xN_y$ (silicon oxynitride), $HfO_2$, $HfSi_xO_y$, $Al_2O_3$, and $ZrO_2$, where x and y, when used in the context of chemical compounds throughout the disclosure, are positive integers which may be the same as or different from one another. The above-described formation method, layer structure, thickness, and material of the tunneling insulation layer 120 are illustrative, and the embodiments of the present invention are not limited thereto.

A charge storage layer 125 is formed on the tunneling insulation layer 120. The charge storage layer 125 may store electric charges injected from the semiconductor substrate 105. For example, the charge storage layer 125 may be a floating type layer. In this case, the charge storage layer 125 can be referred to as a floating gate electrode 125. The floating gate electrode 125 may include a conductive layer, such as a polysilicon layer, for example.

An inter-electrode insulation layer 140 is formed on the charge storage layer 125. The inter-electrode insulation layer 140 may include an interfacial layer 130 and a high-k dielectric layer 135. The interfacial layer 130 may be disposed between the charge storage layer 125 and the high-k dielectric layer 135. The interfacial layer 130 may include a silicon oxynitride ($SiO_xN_y$) layer, for example. The interfacial layer 130 reduces interfacial reactions between the charge storage layer 125 and the high-k dielectric layer 135.

In embodiments of the present invention, the silicon oxynitride layer may be formed by nitriding an oxide layer or oxidizing a nitride layer through a CVD process. More specifically, the silicon oxynitride layer may be formed by atomic layer deposition (ALD). For example, after an oxide layer is formed by CVD or ALD, the oxide layer can be nitrided to form the silicon oxynitride layer. In another example, after a nitride layer is formed, the nitride layer can be oxidized to form the silicon oxynitride layer.

The nitridation may be performed using a $N_2$, $NH_3$, or NO gas through a plasma, radical, or thermal process. The oxidation may be performed using an $O_2$, $O_3$, $H_2O$, NO, or $N_2O$ gas through a plasma, radical, or thermal process. The nitrogen concentration of the silicon oxynitride layer can be adjusted by varying process conditions of the oxidation or nitridation.

The high-k dielectric layer 135 is formed on the interfacial layer 130. In exemplary embodiments of the present invention, the high-k dielectric layer 135 may have a dielectric constant greater than that of a silicon nitride layer. The high-k dielectric layer 135 may include a dielectric material having a dielectric constant of about 8 or higher. For example, the high-k dielectric layer 135 may have a single layer structure formed from one selected from the group consisting of $Al_xO_y$, $Hf_xO_y$, $Zr_xO_y$, $Y_xO_y$, $La_xO_y$, $Ta_xO_y$, $Pr_xO_y$, $Ti_xO_y$, $Al_xSi_yO_z$, $ZrSi_xO_y$, and $HfSi_xO_y$. Alternatively, the high-k dielectric layer 135 may have a single layer structure formed from two or more materials selected from the above-mentioned group. Alternatively, the high-k dielectric layer 135 may have a multi-layer structure including layers each formed from one or more materials selected from the above-mentioned group. In various embodiments, the high-k dielectric layer 135 may have a band gap smaller than that of a silicon oxide layer.

The high-k dielectric layer 135 may be formed by CVD or ALD. Also, the high-k dielectric layer 135 may have a thickness in the range of 30 about A to about 500 Å, for example.

The above-described formation method, layer structure, and material of the high-k dielectric layer 135 are illustrative, and the embodiments of the present invention are not limited thereto. For example, a high-k dielectric layer 135 including double layers such as a hafnium oxide ($Hf_xO_y$) layer and an aluminum oxide ($Al_xO_y$) layer can be formed by ALD by sequentially performing 1) hafnium deposition, 2) nitrogen gas purge, 3) ozone gas oxidation, 4) nitrogen gas purge, 5) aluminum deposition, 6) nitrogen gas purge, 7) ozone gas oxidation, and 8) nitrogen gas purge. In more detail, a hafnium source gas is injected into an ALD chamber to deposit hafnium on a wafer; a nitrogen gas is injected into the ALD chamber to purge the remaining hafnium source gas; an ozone gas is injected into the ALD chamber to oxidize the hafnium deposited on the wafer so as to form a hafnium oxide layer; a nitrogen gas is injected into the ALD chamber to purge the remaining ozone gas; an aluminum source gas is injected into the ALD chamber to deposit aluminum on the hafnium oxide layer; a nitrogen gas is injected into the ALD chamber to purge the remaining aluminum source gas; an ozone gas is injected into the ALD chamber to oxidize the aluminum deposited on the hafnium oxide layer so as to form an aluminum oxide layer; and a nitrogen gas is injected into the ALD chamber to purge the remaining ozone gas. During these operations, the ALD chamber may be kept at a temperature of about 200° C. to about 400° C. and a pressure of about 10 Torr to about 100 Torr.

In the illustrative ALD process, a metal precursor of a metal to be included in the high-k dielectric layer 135 may be used as a source gas. Examples of aluminum precursors include $Al_2O_3$ and $Al(CH_3)_3 \cdot H_2O$; examples of hafnium precursors include $HfO_2$ and $HfCl_4 \cdot H_2O$; examples of zirconium precursors include $ZrO_2$ and $ZrCl_4 \cdot H_2O$; examples of tantalum precursors include $TaO_2$ and $TaCl_5 \cdot H_2O$; and examples of titanium precursors include $TiO_2$ and $TiCl_4 \cdot H_2O$.

Optionally, a heat treatment process can be performed to densify the high-k dielectric layer 135 and to supply insufficient oxygen to the high-k dielectric layer 135. The heat treatment process can be performed using one or a combination of furnace heat treatment, rapid temperature processing (RTP), and rapid temperature annealing (RTA). The heat treatment may be performed in an atmosphere including $O_3$, Ar, $N_2$, or $O_2$, for example. The heat treatment may be performed in the temperature range of about 100° C. to 400° C. at a power level of about 100 W to about 1000 W for about 10 seconds to about 60 seconds. However, the embodiments of the present invention are not limited thereto.

A control gate 150, or control gate electrode, is formed on the inter-electrode insulation layer 140. The control gate 150 may be formed by CVD, for example. The control gate 150 may include a polysilicon layer or a metal layer. The control gate 150 may include a metal layer having a work function of about 4 eV or more than 4 eV. The metal layer having a work function of about 4 eV or more than 4 eV may include one or a combination of titanium (Ti), titanium nitride (TiN), tantalum nitride (TaN), tantalum (Ta), tungsten (W), tungsten nitride (WN), hafnium (Hf), niobium (Nb), molybdenum (Mo), ruthenium dioxide ($RuO_2$), $Mo_2N$, iridium (Ir), platinum (Pt), cobalt (Co), chromium (Cr), RuO, $Ti_3Al$, $Ti_2AlN$, palladium (Pd), tungsten nitride (WNx), tungsten silicide (WSi), and nickel silicide (NiSi). The control gate 150 may have a thickness in the range of about 500 Å to about 2000 Å, for example. The above-mentioned formation method, layer structure, and material of the control gate 150 are illustrative, and the embodiments of the present invention are not limited thereto.

Characteristics of nonvolatile memory devices including various interfacial layers will now be compared.

Figure 6:
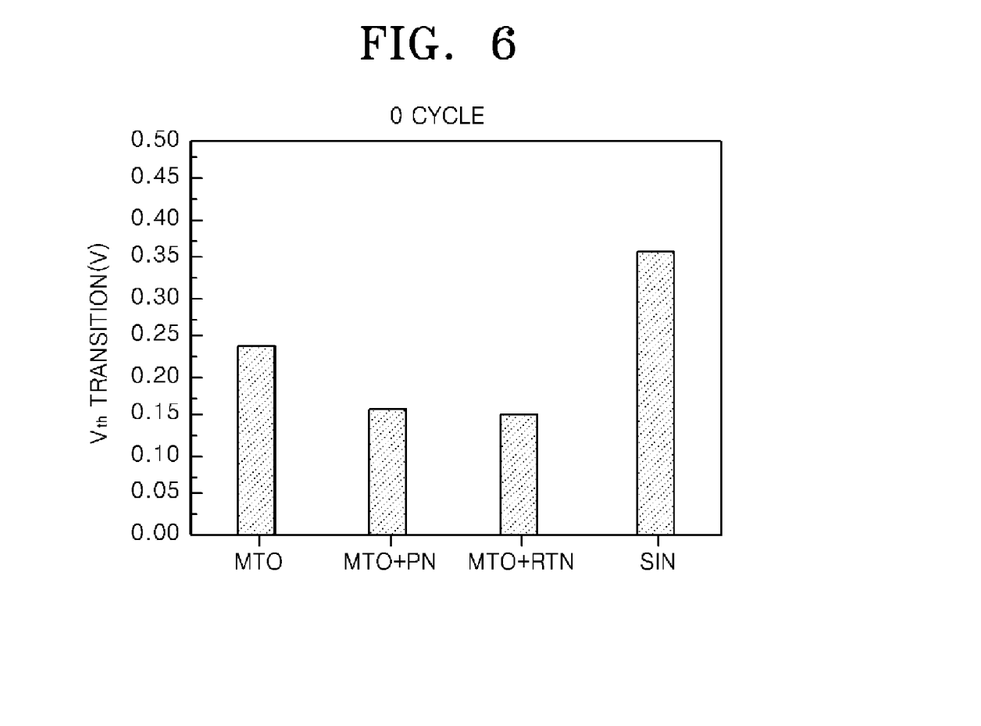
FIGS. 6 and 7 are graphs illustrating hot temperature stress (HTS) characteristics of nonvolatile memory devices including different interfacial layers.
Figure 7:
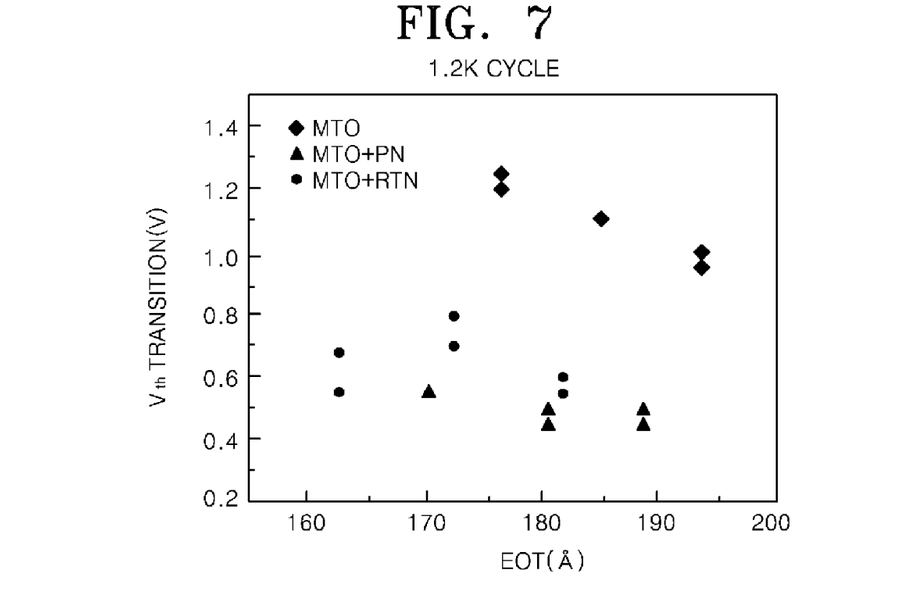

FIGS. 6 and 7 are graphs illustrating hot temperature stress (HTS) characteristics of nonvolatile memory devices including different interfacial layers. HTS analysis is a method of measuring transition of threshold voltage $V_{th}$ of a device caused by a high-temperature heat treatment to estimate variations of charge of the device and to evaluate characteristics of the device. The transition of threshold voltage $V_{th}$ of the device represents the amount of electric charge of the device reduced by a high-temperature heat treatment. Generally, a device having good characteristics exhibits a small amount of threshold voltage transition after a high-temperature heat treatment.

Referring to FIGS. 6 and 7, a silicon oxide layer (MTO), a silicon oxide layer treated by plasma nitridation (MTO+PN), a silicon oxide layer treated by rapid thermal nitridation (MTO+RTN), and a silicon nitride layer (SIN) are compared as interfacial layers of nonvolatile memory devices. FIG. 6 shows transitions of threshold voltages $V_{th}$ of the nonvolatile memory devices caused by electric charge reduction after the nonvolatile memory devices were baked at about 200° C. for about 2 hours in a written state with no write/erase operation before the nonvolatile memory devices were baked. FIG. 7 shows transitions of threshold voltages $V_{th}$ of the nonvolatile memory devices after a write/erase operation was performed on the nonvolatile memory devices for 1,200 cycles and the nonvolatile memory devices were baked at about 200° C. for about 2 hours in a written state.

Referring to FIGS. 6 and 7, the transitions of threshold voltages $V_{th}$ of the MTO+PN and the MTO+RTN (i.e., silicon oxynitride layers) are smaller than that of the MTO (i.e., a silicon oxide layer) regardless of cycles of the write/erase operation. In addition, referring to FIG. 6, the transitions of the threshold voltages $V_{th}$ of the silicon oxynitride layers MTO+PN and MTO+RTN are smaller than that of the silicon nitride layer SIN.

That is, the characteristics of a nonvolatile memory device can be improved when the nonvolatile memory device includes a silicon oxynitride layer as an interfacial layer, as compared to the case in which the nonvolatile memory device includes a silicon oxide layer or a silicon nitride layer as an interfacial layer. The nitrogen concentration of the silicon oxynitride layer used as an interfacial layer of the nonvolatile memory device may vary within a desirable range.

Figure 8:
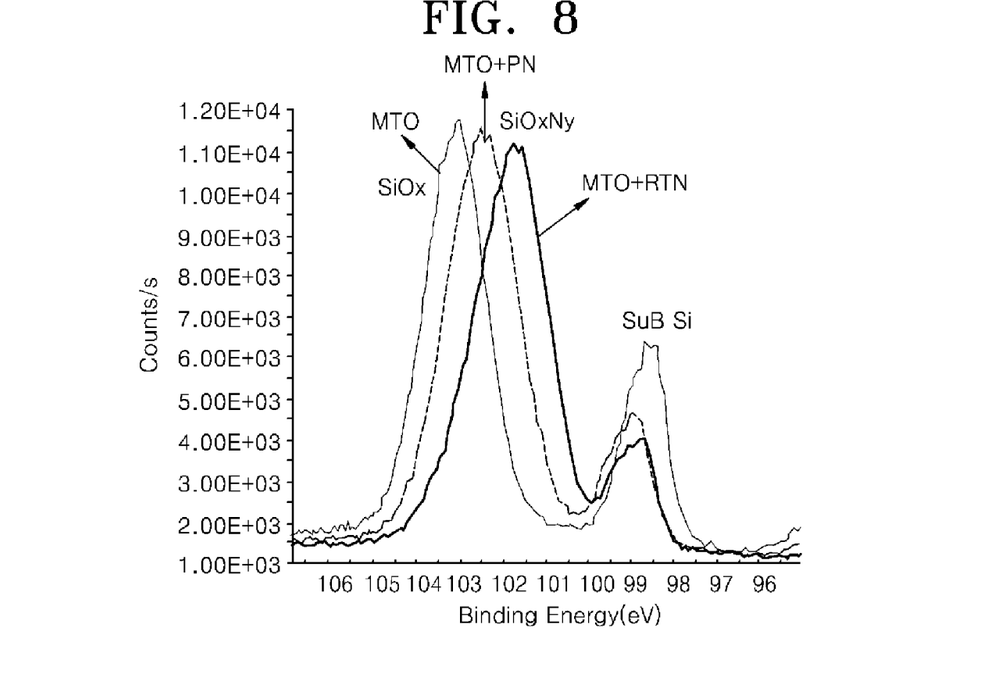
FIG. 8 is a graph illustrating x-ray photoelectron spectroscopy (XPS) analysis results of different interfacial layers.

FIG. 8 is a graph illustrating x-ray photoelectron spectroscopy (XPS) analysis results of different interfacial layers. The XPS analysis was performed on a silicon oxide layer (MTO), a silicon oxide layer treated by plasma nitridation (MTO+PN), and a silicon oxide layer treated by rapid thermal nitridation (MTO+RTN) that were grown on a silicon substrate to a thickness of about 25 Å.

Referring to FIG. 8, the MTO+PN and the MTO+RTN have a binding energy curve of a silicon oxynitride layer ($SiO_xY_y$). Table 1 below shows composition ratios of the MTO, MTO+PN, and the MTO+RTN obtained from the XPS analysis of FIG. 8.

TABLE 1

| Sample | Composition ratio (atom %) | | | |
|---|---|---|---|---|
| | Si | C | N | O |
| MTO | 30.7 | 4.3 | | 65 |
| MTO + PN | 35 | 3.3 | 14.6 | 47.2 |
| MTO + RTN | 37.5 | 5.1 | 28.1 | 29.3 |

Referring to Table 1, the MTO+PN includes about 15% of nitrogen, and the MTO+RTN includes about 28% of nitrogen. It can be estimated from the results shown in Table 1 that a silicon oxynitride layer has good HTS characteristics when the nitrogen concentration of the silicon oxynitride layer is lower than about 50%. For example, the nitrogen concentration of the silicon oxynitride layer may be about 5% to about 35%.

Figure 9:
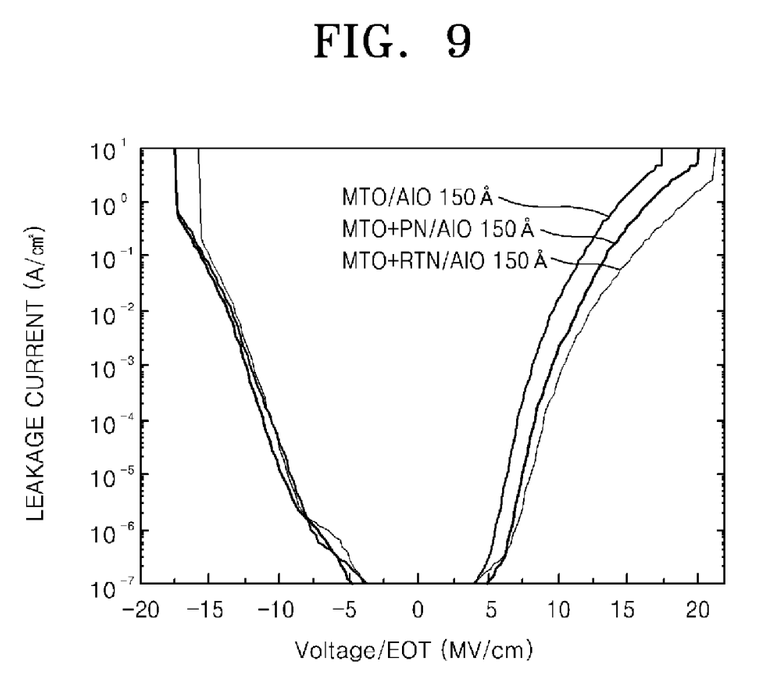
FIG. 9 is a graph illustrating current leakage characteristics of nonvolatile memory devices including different interfacial layers.

FIG. 9 is a graph illustrating current leakage characteristics of nonvolatile memory devices including different interfacial layers. In FIG. 9, a silicon oxide layer (MTO), a silicon oxide layer treated by plasma nitridation (MTO+PN), and a silicon oxide layer treated by rapid thermal nitridation (MTO+RTN) were formed as interfacial layers to be compared, and aluminum oxide layers were formed on the respective interfacial layers as high-k dielectric layers. Current leakage was measured between a control gate and a semiconductor substrate.

Referring to FIG. 9, current leakage levels of the MTO, the MTO+PN, and the MTO+RTN decrease in the order listed. Therefore, it can be understood that current leakage is small when a silicon oxynitride layer is used as an interfacial layer as compared to the case in which a silicon oxide layer is used as an interfacial layer.

Figure 2:
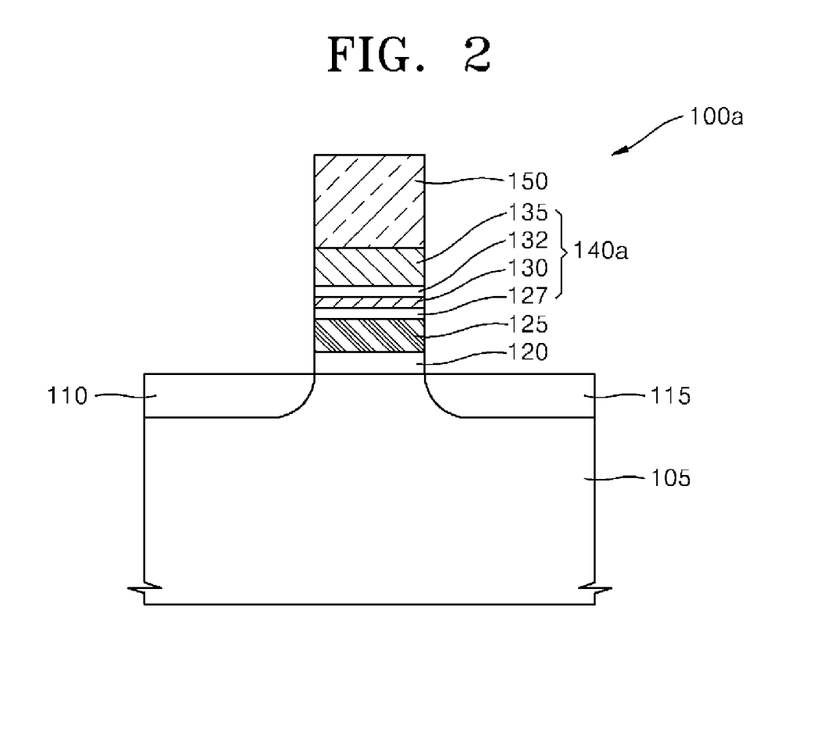
FIG. 2 is a cross-sectional view illustrating a nonvolatile memory device, according to another embodiment of the present invention.

FIG. 2 is a cross-sectional view illustrating a nonvolatile memory device 100a, according to another illustrative embodiment of the present invention. The nonvolatile memory device 100a of the current embodiment is a modified version of the nonvolatile memory device 100 shown in FIG. 1. Thus, in the following description, the elements of the nonvolatile memory device 100a that are the same as those elements of the nonvolatile memory device 100 will not be described again for conciseness.

Referring to FIG. 2, an inter-electrode insulation layer 140a includes an interfacial layer 130 and a high-k dielectric layer 135. The inter-electrode insulation layer 140a further includes a first subsidiary interfacial layer 127 and a second subsidiary interfacial layer 132. The first subsidiary interfacial layer 127 is between the charge storage layer 125 and the interfacial layer 130. The second subsidiary interfacial layer 132 is between the interfacial layer 130 and the high-k dielectric layer 135.

In addition to the interfacial layer 130, the first and second subsidiary interfacial layers 127 and 132 prevent reactions between the charge storage layer 125 and the high-k dielectric layer 135. For example, the first and second subsidiary interfacial layers 127 and 132 may include a silicon oxide layer or a silicon nitride layer.

In various versions of the nonvolatile memory device 100a, one of the first and second subsidiary interfacial layers 127 and 132 can be omitted.

Figure 3:
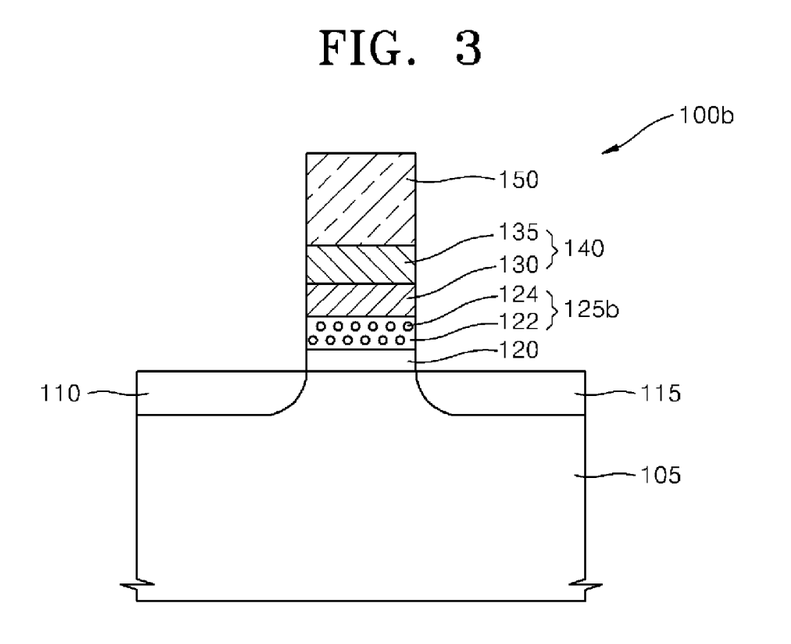
FIG. 3 is a cross-sectional view illustrating a nonvolatile memory device, according to another embodiment of the present invention.

FIG. 3 is a cross-sectional view illustrating a nonvolatile memory device 100b, according to another illustrative embodiment of the present invention. The nonvolatile memory device 100b of the current embodiment is a modified version of the nonvolatile memory device 100 shown in FIG. 1. Thus, in the following description, the elements of the nonvolatile memory device 100b that are the same as those elements of the nonvolatile memory device 100 will not be described again for conciseness.

Referring to FIG. 3, a charge storage layer 125b includes an insulation layer 122 and conductive fine particles 124 (or nanoparticles) included in the insulation layer 122. The fine particles 124 may be formed, for example, from a metal or semiconductor. For example, the fine particles 124 may be formed from silicon or germanium. The fine particles 124 may be used to store or trap electric charges. For example, the fine particles 124 may include nanocrystals or quantum dots. An effective number of nanocrystals or quantum dots may be distributed in the insulation layer 122. Each of the nanocrystals or quantum dots may be used as a charge storage or trap site. That is, the charge storage layer 125b can operate in multi-bit mode using such local charge storage characteristics.

Since the fine particles 124 are conductive, the fine particles 124 can react with the high-k dielectric layer 135 in the case where an interfacial layer 130 is not formed. Therefore, the interfacial layer 130 is needed to prevent the charge storage layer 125b including the fine particles 124 from reacting with the high-k dielectric layer 135, as the interfacial layer 130 is needed in the nonvolatile memory device 100 of FIG. 1 to prevent the charge storage layer 125 formed from a polysilicon layer from reacting with the high-k dielectric layer 135.

The insulation layer 122 is formed from a proper material. For example, the insulation layer 122 may include a silicon oxide layer, a silicon nitride layer, or a silicon oxynitride layer. In the case where the insulation layer 122 includes a silicon oxynitride layer, the fine particles 124 can be exposed at a surface of the insulation layer 122. Therefore, the interfacial layer 130 may be formed on the charge storage layer 125b to cover the fine particles 124. The above-described materials for the insulation layer 122 and the fine particles 124 are illustrative, and the embodiment is not limited thereto.

In another embodiment, a first subsidiary interfacial layer 127 and/or a second subsidiary interfacial layer 132, as shown in FIG. 2, may be additionally included in an inter-electrode insulation layer 140 of the nonvolatile memory device 100b in FIG. 3.

The nonvolatile memory devices 100, 100a, and 100b of the above-described illustrative embodiments can be applied to erasable and programmable read only memories (EPROM), as well as flash memories. The nonvolatile memory devices 100, 100a, and 100b can be formed, for example, through a self aligned-shallow trench isolation (SA-STI) process or a self aligned poly (SAP) process when 70-nm or lower level flash memories are fabricated. Hereinafter, NAND flash memories will be described as examples, according to embodiments of the present invention, with reference to FIGS. 4 and 5.

Figure 4:
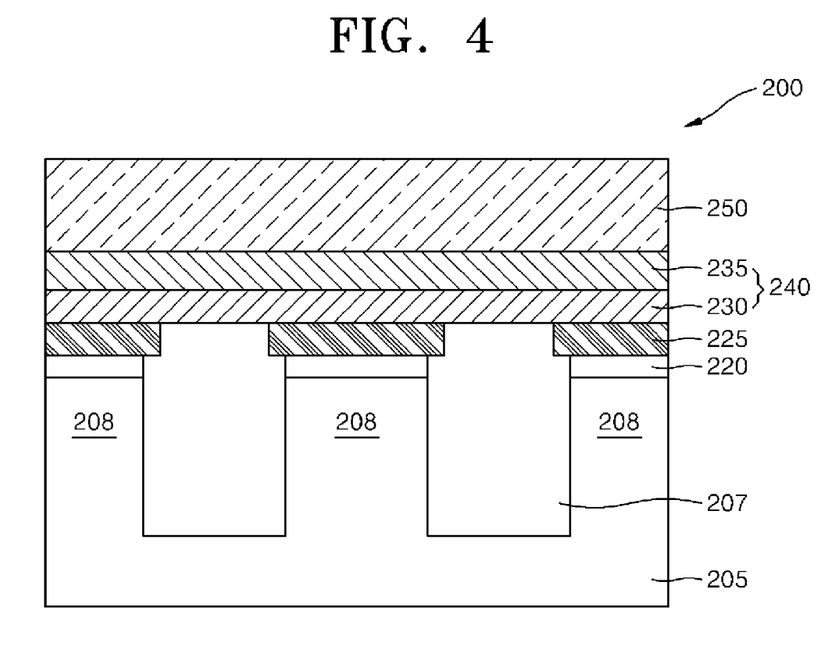
FIG. 4 is a cross-sectional view illustrating a NAND flash memory device, according to an embodiment of the present invention.

FIG. 4 is a cross-sectional view illustrating a NAND flash memory device 200, according to an illustrative embodiment of the present invention. FIG. 4 is a cross-sectional view of the NAND flash memory device 200 taken in the direction of a word line. A cross-sectional view of the NAND flash memory device 200 taken in the direction of a bit line may be similar to FIGS. 1 through 3.

Referring to FIG. 4, multiple device isolation layers 207 define active regions 208 in a semiconductor substrate 205. The device isolation layers 207 may be formed in a STI type, for example. A tunneling insulation layer 220 may be formed on the active regions 208. A charge storage layer 225 may be formed on the tunneling insulation layer 220. The tunneling insulation layer 220 can be understood using the description of the tunneling insulation layer 120 of FIG. 1, and the charge storage layer 225 can be understood using the descriptions of the charge storage layer 125 and the charge storage layer 125b of FIGS. 1 through 3.

In the depicted illustrative embodiment, the charge storage layer 225 has portions protruding into the device isolation layers 207 for increasing the sectional area of the charge storage layer 225. For example, before the charge storage layer 225 is formed, sidewalls of the device isolation layers 207 can be recessed to increase the width of the charge storage layer 225.

The top surface of the charge storage layer 225 may have the same height as the top surfaces of the device isolation layers 207. For example, after forming the charge storage layer 225 between the device isolation layers 207, planarization can be performed to align the top surface of the charge storage layer 225 with the top surfaces of the device isolation layers 207. Accordingly, an inter-electrode insulation layer 240 can be formed having a planar shape, such that a planar surface of the insulation layer 240 extends on the top surfaces of the 225 and the device isolation layers 207. The inter-electrode insulation layer 240 may include an interfacial layer 230 and a high-k dielectric layer 235. The inter-electrode insulation layer 240 can be understood from the description of the inter-electrode insulation layer 140 of FIG. 1. In an embodiment, the inter-electrode insulation layer 240 may further include a first subsidiary interfacial layer 127 and/or a second subsidiary interfacial layer 132, as shown, for example, in the inter-electrode insulation layer 140a illustrated in FIG. 2.

A control gate electrode 250 is formed on the inter-electrode insulation layer 240 having a planar shape. The control gate electrode 250 can be understood from the description of the control gate 150 of FIG. 1.

Figure 5:
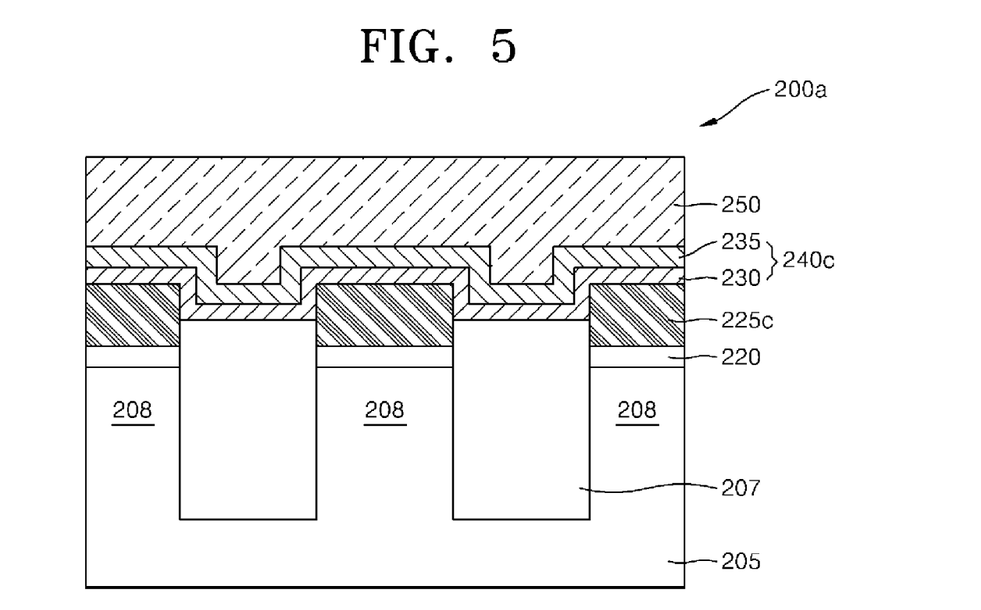
FIG. 5 is a cross-sectional view illustrating a NAND flash memory device, according to another embodiment of the present invention.

FIG. 5 is a cross-sectional view illustrating a NAND flash memory device 200a, according to another illustrative embodiment of the present invention. The NAND flash memory device 200a of the current embodiment is a modified version of the NAND flash memory device 200 shown in FIG. 4. Thus, in the following description, the elements of the NAND flash memory device 200a that are the same as those elements of the NAND flash memory device 200 will not be described again for conciseness.

Referring to FIG. 5, a top surface of a charge storage layer 225c protrudes beyond the top surfaces of device isolation layers 207. Thus, sidewalls of the charge storage layer 225c are exposed in relation to the device isolation layers 207. An inter-electrode insulation layer 240c may be formed on the charge storage layer 225c and the device isolation layers 207 in a generally corrugated shape, as shown in FIG. 5, such that a surface of the inter-electrode insulation layer 240c follows the contours of the varying top surfaces of the charge storage layer 225c and the device isolation layers 207. That is, the inter-electrode insulation layer 240c covers side or lateral surfaces of the charge storage layer 225c, as well as the top or horizontal surfaces of the charge storage layer 225c. In this case, the contact area between the inter-electrode insulation layer 240c and the charge storage layer 225c increases, and thus the NAND flash memory device 200a has a higher coupling ratio. A control gate electrode 250 may be formed on the inter-electrode insulation layer 240c.

In a variation of the NAND flash memory device 200a, the charge storage layer 225c may have portions protruding into the device isolation layers 207 to increase the width of the charge storage layer 225c, as shown, for example, with respect to the charge storage layer 225 illustrated in FIG. 4.

While the present invention has been particularly shown and described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A nonvolatile memory device, comprising:
   a semiconductor substrate;
   a tunneling insulation layer on the semiconductor substrate;
   a charge storage layer on the tunneling insulation layer;
   an inter-electrode insulation layer on the charge storage layer; and
   a control gate electrode on the inter-electrode insulation layer, wherein the inter-electrode insulation layer comprises:
      a high-k dielectric layer having a dielectric constant greater than that of a silicon nitride; and
      an interfacial layer between the charge storage layer and the high-k dielectric layer, the interfacial layer comprising a silicon oxynitride layer, the silicon oxynitride layer comprising about 5 to about 35 atomic percent of nitrogen.

2. The nonvolatile memory device of claim 1, further comprising:
   a plurality of device isolation layers defining active regions in the semiconductor substrate, wherein the tunneling insulation layer is formed on the active regions.

3. The nonvolatile memory device of claim 2, wherein the charge storage layer is between the device isolation layers, and the charge storage layer has a top surface at the same height as top surfaces of the plurality of device isolation layers.

4. The nonvolatile memory device of claim 3, wherein the inter-electrode insulation layer has a planar shape extending on the plurality of device isolation layers and the charge storage layer.

5. The nonvolatile memory device of claim 2, wherein the charge storage layer has a top surface higher than top surfaces of the plurality of device isolation layers, and the inter-electrode insulation layer is formed on the charge storage layer and the device isolation layers in a corrugated shape.

6. The nonvolatile memory device of claim 1, wherein the inter-electrode insulation layer further comprises a first subsidiary interfacial layer between the charge storage layer and the interfacial layer.

7. The nonvolatile memory device of claim 6, wherein the first subsidiary interfacial layer comprises one of a silicon oxide layer or a silicon nitride layer.

8. The nonvolatile memory device of claim 1, wherein the inter-electrode insulation layer further comprises a second subsidiary interfacial layer between the interfacial layer and the high-k dielectric layer.

9. The nonvolatile memory device of claim 8, wherein the second subsidiary interfacial layer comprises one of a silicon oxide layer or a silicon nitride layer.

10. The nonvolatile memory device of claim 1, wherein the inter-electrode insulation layer further comprises:
    a first subsidiary interfacial layer between the charge storage layer and the interfacial layer; and
    a second subsidiary interfacial layer between the interfacial layer and the high-k dielectric layer.

11. The nonvolatile memory device of claim 1, wherein the control gate electrode comprises a metal layer having a work function of 4.0 eV or higher.

12. The nonvolatile memory device of claim 11, wherein the metal layer comprises at least one of titanium (Ti), titanium nitride (TiN), tantalum nitride (TaN), tantalum (Ta), tungsten (W), tungsten nitride (WN), hafnium (HO, niobium (Nb), molybdenum (Mo), ruthenium dioxide ($RuO_2$), $Mo_2N$, iridium (Ir), platinum (Pt), cobalt (Co), chromium (Cr), RuO, $Ti_3Al$, $Ti_2AlN$, palladium (Pd), tungsten nitride (WNx), tungsten silicide (WSi), nickel silicide (NiSi).

13. The nonvolatile memory device of claim 1, wherein the charge storage layer comprises a floating type polysilicon layer.

14. The nonvolatile memory device of claim 1, wherein the charge storage layer comprises nanocrystals or quantum dots.

15. The nonvolatile memory device of claim 1, wherein the high-k dielectric layer comprises at least one of $Al_xO_y$, $Hf_xO_y$, $Zr_xO_y$, $Y_xO_y$, $La_xO_y$, $Ta_xO_y$, $Pr_xO_y$, $Ti_xO_y$, $Al_xSi_yO_z$, $ZrSi_xO_y$, $HfSi_xO_y$.

16. The nonvolatile memory device of claim 1, wherein the interfacial layer is formed by depositing the silicon oxynitride layer on the charge storage layer by chemical vapor deposition (CVD) or atomic layer deposition (ALD).

17. The nonvolatile memory device of claim 1, wherein the interfacial layer is formed by nitriding a silicon oxide layer.

18. The nonvolatile memory device of claim 1, wherein the interfacial layer is formed by oxidizing a silicon nitride layer.

* * * * *